US011555110B2

(12) United States Patent
Kim et al.

(10) Patent No.: US 11,555,110 B2
(45) Date of Patent: Jan. 17, 2023

(54) HEAT-RESISTANT RESIN COMPOSITION

(71) Applicant: LG CHEM, LTD., Seoul (KR)

(72) Inventors: Do Hyeong Kim, Daejeon (KR); Ho Namgung, Daejeon (KR); Seong Lyong Kim, Daejeon (KR); Dae San Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 113 days.

(21) Appl. No.: 16/758,343

(22) PCT Filed: Dec. 4, 2018

(86) PCT No.: PCT/KR2018/015250
§ 371 (c)(1),
(2) Date: Apr. 22, 2020

(87) PCT Pub. No.: WO2019/112294
PCT Pub. Date: Jun. 13, 2019

(65) Prior Publication Data
US 2020/0339799 A1 Oct. 29, 2020

(30) Foreign Application Priority Data

Dec. 4, 2017 (KR) .................. 10-2017-0165309
Dec. 3, 2018 (KR) .................. 10-2018-0153837

(51) Int. Cl.
*C08L 55/02* (2006.01)
*C08F 212/08* (2006.01)
*C08F 279/04* (2006.01)
*C08L 25/12* (2006.01)
*C08L 35/06* (2006.01)

(52) U.S. Cl.
CPC ............ *C08L 55/02* (2013.01); *C08F 212/08* (2013.01); *C08F 279/04* (2013.01); *C08L 25/12* (2013.01); *C08L 35/06* (2013.01)

(58) Field of Classification Search
CPC .... C08L 55/02; C08L 25/12; C08L 2205/035; C08L 2205/02; C08L 2205/025
See application file for complete search history.

(56) References Cited

U.S. PATENT DOCUMENTS

| 5,990,240 A | 11/1999 | Mishima et al. | |
| 2008/0093578 A1* | 4/2008 | Park | C08L 25/12 |
| | | | 252/68 |
| 2011/0319567 A1* | 12/2011 | Noguchi | C08L 55/02 |
| | | | 525/205 |
| 2013/0281568 A1 | 10/2013 | Park et al. | |
| 2014/0323643 A1* | 10/2014 | Duc | F25D 23/08 |
| | | | 524/525 |
| 2015/0111041 A1 | 4/2015 | Motegi et al. | |
| 2018/0086906 A1* | 3/2018 | Eim | C08L 25/12 |
| 2021/0108069 A1* | 4/2021 | Niessner | C08L 35/06 |

FOREIGN PATENT DOCUMENTS

| EP | 2388282 A1 | 11/2011 |
| KR | 100528768 B1 | 11/2005 |
| KR | 20060078137 A | 7/2006 |
| KR | 20060079518 A | 7/2006 |
| KR | 20060118820 A | 11/2006 |
| KR | 20070047073 A | 5/2007 |
| KR | 20070072117 A | 7/2007 |
| KR | 20090081176 A | 7/2009 |
| KR | 101293789 B1 | 8/2013 |
| KR | 20140114458 A | 9/2014 |
| KR | 20140147286 A | 12/2014 |
| KR | 20150067743 A | 6/2015 |
| KR | 20150102446 A | 9/2015 |
| WO | WO 2006/070986 A1 | 6/2006 |

OTHER PUBLICATIONS

Extended European Search Report for EP 18885822.9; dated Oct. 15, 2020; 5 pages.
Office Action dated Jun. 22, 2022, issued in corresponding Chinese Patent Application No. 201880069189.6.
"Practical Handbook for Plastics Industry" vol. 1 (Second edition), Editor-in-Chief: Hao Ding, Chemical Industry Press, Aug. 31, 2000, p. 180.

\* cited by examiner

*Primary Examiner* — Jeffrey C Mullis
(74) *Attorney, Agent, or Firm* — Morgan, Lewis & Bockius LLP

(57) ABSTRACT

Provided is a heat-resistant resin composition which includes: a graft copolymer prepared by graft polymerization of a diene-based rubber polymer with an aromatic vinyl-based monomer and a vinyl cyan-based monomer; a first styrene-based copolymer including a maleimide-based unit and an aromatic vinyl-based unit; a second styrene-based copolymer including a vinyl cyan-based unit and an aromatic vinyl-based unit; and a third styrene-based copolymer including a vinyl cyan-based unit and an aromatic vinyl-based unit, wherein the second styrene-based copolymer and the third styrene-based copolymer include a vinyl cyan-based unit in mutually different amounts.

9 Claims, No Drawings

HEAT-RESISTANT RESIN COMPOSITION

CROSS-REFERENCE TO RELATED APPLICATION

This application claims priority to and the benefit of Korean Patent Application No. 10-2017-0165309, filed on Dec. 4, 2017, and Korean Patent Application No. 10-2018-0153837, filed on Dec. 3, 2018, the disclosures of which are incorporated herein by reference in their entirety.

TECHNICAL FIELD

The present invention relates to a heat-resistant resin composition, and more particularly, to a heat-resistant resin composition capable of preparing a heat-resistant resin molded article with excellent surface characteristics after metal deposition.

BACKGROUND ART

An acrylonitrile-butadiene-styrene copolymer (hereinafter, referred to as "ABS copolymer") is a graft copolymer prepared by graft polymerization of a butadiene rubber polymer with styrene and acrylonitrile. The ABS copolymer has been used in various fields including all types of electrical and electronic product housing and components, interior and exterior materials of an automobile, and miscellaneous products by adjusting the content of components according to the purpose.

Meanwhile, plastic made of the ABS copolymer may realize excellent properties relative to weight due to its unique low density and may be applied to various components by modifying the surface thereof. Also, a surface of plastic may be subjected to Al deposition to realize the surface with various designs. The Al deposition may be applied to various designs, may proceed rapidly, and does not cause cracking with respect to chemical resistance because there is no chemical treatment.

However, the Al deposition proceeds in such a way that Al is deposited to an average thickness of 1 µm or less, and thus surface reflectance may be significantly degraded due to a slight scratch or gas mark on the surface of plastic.

Therefore, research on improvement of injection moldability of a plastic material is continuing to solve this problem.

DISCLOSURE

Technical Problem

The present invention is directed to providing a heat-resistant resin composition with excellent heat resistance and surface characteristics.

Technical Solution

According to an embodiment of the present invention, there is provided a heat-resistant resin composition which includes a graft copolymer prepared by graft polymerization of a diene-based rubber polymer with an aromatic vinyl-based monomer and a vinyl cyan-based monomer; a first styrene-based copolymer including a maleimide-based unit and an aromatic vinyl-based unit; a second styrene-based copolymer including a vinyl cyan-based unit and an aromatic vinyl-based unit; and a third styrene-based copolymer including a vinyl cyan-based unit and an aromatic vinyl-based unit, wherein the second styrene-based copolymer and the third styrene-based copolymer include a vinyl cyan-based unit in mutually different amounts.

In addition, according to another embodiment of the present invention, there is provided a heat-resistant resin pellet prepared using the above-described heat-resistant resin composition and having a melt flow index of 10 g/10 min or more.

In addition, according to still another embodiment of the present invention, there is provided a heat-resistant resin molded article formed of the above-described heat-resistant resin composition and having a diffuse reflectance of 4% or less after metal deposition.

Advantageous Effects

A heat-resistant resin composition according to the present invention can realize excellent heat resistance, fluidity, and surface characteristics. Accordingly, a heat-resistant resin molded article which exhibits excellent surface characteristics even when metal is deposited on the surface can be prepared.

MODE FOR INVENTION

Hereinafter, the present invention will be described in more detail.

Terms and words used in this specification and claims should not be interpreted as limited to commonly used meanings or meanings in dictionaries and should be interpreted with meanings and concepts which are consistent with the technological scope of the invention based on the principle that the inventors have appropriately defined concepts of terms in order to describe the invention in the best way.

In the present invention, the average particle size of a diene-based rubber polymer may be measured by dynamic light scattering, and specifically, may be measured using a scattering analyzer (Nicomp 380 HPL manufactured by PSS Nicomp).

In the specification, an average particle size may refer to an average particle in a scattering intensity distribution in the particle size distribution as measured by dynamic light scattering.

In the present invention, the degree of grafting may be calculated by adding a predetermined amount of a graft copolymer to a solvent, followed by dissolution using a vibrator, centrifugation using a centrifuge, and drying to obtain an insoluble content, and then by using the insoluble content and the following equation.

Specifically, the degree of grafting may be calculated by adding a predetermined amount of a graft copolymer to acetone; dissolving the free graft copolymer through vibration using a vibrator (trade name: SI-600R manufactured by Lab. Companion) for 24 hours; centrifuging the resultant substance using a centrifuge at 14,000 rpm for 1 hour; and drying using a vacuum dryer (trade name: DRV320DB manufactured by Advantec) at 140° C. for 2 hours to obtain an insoluble content, and then by using the insoluble content and the following Equation.

$$\text{Degree of grafting (\%)} = (Y-(X \times R))/(X \times R) \times 100$$

Y: Weight of insoluble content

X: Weight of graft copolymer added upon obtaining insoluble content

R: Fraction of diene-based rubber polymer in graft copolymer added upon obtaining insoluble content In the present invention, a weight average molecular weight may be measured as a relative value with respect to standard polystyrene (PS) using tetrahydrofuran (THF) as an elution solvent through gel permeation chromatography (GPC; Waters Breeze).

In the present invention, a melt flow index may be measured under conditions of 220° C. and 10 kg in accordance with ASTM 1238.

In the present invention, a diffuse reflectance and a total reflectance may be measured by measuring a diffuse reflectance and a specular reflectance using a surface glossmeter (trade name: Reflectometer (TR-1100AD) manufactured by Tokyo Denshoku Co., Ltd).

1. Heat-Resistant Resin Composition

A heat-resistant resin composition according to an embodiment of the present invention includes 1) a graft copolymer prepared by graft polymerization of a diene-based rubber polymer with an aromatic vinyl-based monomer and a vinyl cyan-based monomer; 2) a first styrene-based copolymer including a maleimide-based unit and an aromatic vinyl-based unit; 3) a second styrene-based copolymer including a vinyl cyan-based unit and an aromatic vinyl-based unit; and 4) a third styrene-based copolymer including a vinyl cyan-based unit and an aromatic vinyl-based unit, wherein the second styrene-based copolymer and the third styrene-based copolymer include a vinyl cyan-based unit in mutually different amounts.

The heat-resistant resin composition according to an embodiment of the present invention may further include 5) a fourth styrene-based copolymer.

Hereinafter, each component of the heat-resistant resin composition according to an embodiment of the present invention will be described in detail.

1) Graft Copolymer

The graft copolymer is prepared by graft polymerization of a diene-based rubber polymer with an aromatic vinyl-based monomer and a vinyl cyan-based monomer.

The graft copolymer may impart excellent impact resistance to the heat-resistant resin composition and may improve chemical resistance and processability.

The diene-based rubber polymer is a cross-linking polymer prepared by cross-linking a conjugated diene-based monomer and allows the graft copolymer to attain excellent impact resistance. The conjugated diene-based monomer may be one or more selected from the group consisting of 1,3-butadiene, isoprene, chloroprene, and piperylene, and, among these compounds, 1,3-butadiene is preferred.

The diene-based rubber polymer may be included in an amount of 45 to 75 parts by weight, 50 to 70 parts by weight, or 55 to 65 parts by weight with respect to 100 parts by weight of the sum of the diene-based rubber polymer, the aromatic vinyl-based monomer, and the vinyl cyan-based monomer added upon the preparation of the graft copolymer, and is preferably included in an amount of 55 to 65 parts by weight. When the content of the diene-based rubber polymer falls within the above range, the graft copolymer may attain further improved impact resistance.

The aromatic vinyl-based monomer may be one or more selected from the group consisting of styrene, α-methylstyrene, α-ethylstyrene, and p-methylstyrene, and, among these compounds, styrene is preferred.

The aromatic vinyl-based monomer may be included in an amount of 15 to 45 parts by weight, 20 to 40 parts by weight, or 25 to 35 parts by weight with respect to 100 parts by weight of the sum of the diene-based rubber polymer, the aromatic vinyl-based monomer, and the vinyl cyan-based monomer added upon the preparation of the graft copolymer, and is preferably included in an amount of 25 to 35 parts by weight. When the content of the aromatic vinyl-based monomer falls within the above range, compatibility with first to fifth styrene-based copolymers may be improved to uniformly disperse the graft copolymer in the heat-resistant resin composition, and thus the heat-resistant resin composition may attain further improved impact resistance.

The vinyl cyan-based monomer may be one or more selected from the group consisting of acrylonitrile, methacrylonitrile, ethacrylonitrile, phenylacrylonitrile, and α-chloroacrylonitrile, and, among these compounds, acrylonitrile is preferred.

The vinyl cyan-based monomer may be included in an amount of 1 to 20 parts by weight, 3 to 17 parts by weight, or 5 to 12 parts by weight with respect to 100 parts by weight of the sum of the diene-based rubber polymer, the aromatic vinyl-based monomer, and the vinyl cyan-based monomer added upon the preparation of the graft copolymer, and is preferably included in an amount of 5 to 12 parts by weight. When the content of the vinyl cyan-based monomer falls within the above range, compatibility with second to fifth styrene-based copolymers may be improved to uniformly disperse the graft copolymer in the heat-resistant resin composition, and thus the heat-resistant resin composition may attain further improved impact resistance.

The degree of grafting for the graft copolymer may be 10 to 60%, 20 to 50%, or 30 to 40%, and is preferably 30 to 40%. When the degree of grafting for the graft copolymer falls within the above range, thermal stability and mechanical properties of the graft copolymer are harmoniously realized.

The graft copolymer may be included in an amount of 10 to 45 wt %, 10 to 40 wt %, or 15 to 35 wt % with respect to the total weight of the heat-resistant resin composition, and is preferably included in an amount of 15 to 35 wt %. When the content of the graft copolymer falls within the above range, the heat-resistant resin composition may attain further improved impact resistance.

Meanwhile, the graft copolymer may include a first graft copolymer and a second graft copolymer including diene-based rubber polymers with mutually different average particle sizes to further improve surface characteristics and impact resistance.

The first graft copolymer may include a diene-based rubber polymer having an average particle size of 200 to 500 nm, 250 to 450 nm, or 300 to 400 nm, and preferably includes a diene-based rubber polymer having an average particle size of 300 to 400 nm. When the average particle size of the diene-based rubber polymer falls within the above range, the heat-resistant resin composition may attain further improved impact resistance.

The first graft copolymer may be included in an amount of 9 to 28 wt % or 13 to 23 wt % with respect to the total weight of the heat-resistant resin composition, and is preferably included in an amount of 13 to 23 wt %. When the content of the first graft copolymer falls within the above range, the heat-resistant resin composition may attain an improvement in both impact resistance and surface characteristics.

The second graft copolymer may include a diene-based rubber polymer having an average particle size of 50 to 190 nm, 60 to 150 nm, or 80 to 120 nm, and preferably includes a diene-based rubber polymer having an average particle size of 80 to 120 nm. When the content of the second graft copolymer falls within the above range, the heat-resistant resin composition may attain an improvement in both impact resistance and surface characteristics.

The second graft copolymer may be included in an amount of 1 to 17 wt % or 2 to 12 wt % with respect to the total weight of the heat-resistant resin composition, and is preferably included in an amount of 2 to 12 wt %. When the content of the second graft copolymer falls within the above range, the heat-resistant resin composition may attain an improvement in both impact resistance and surface characteristics.

2) First Styrene-Based Copolymer

The first styrene-based copolymer includes a maleimide-based unit and an aromatic vinyl-based unit.

The first styrene-based copolymer may impart high fluidity, excellent heat resistance, and excellent surface characteristics to the heat-resistant resin composition. Therefore, such a heat-resistant resin composition may be used to prepare a heat-resistant resin molded article which exhibits excellent surface characteristics even after metal deposition.

The maleimide-based unit is a unit derived from a maleimide-based monomer. The maleimide-based monomer may be one or more selected from the group consisting of maleimide, N-methylmaleimide, N-ethylmaleimide, N-propylmaleimide, N-isopropylmaleimide N-butylmaleimide, N-isobutylmaleimide, N-t-butylmaleimide, N-laurylmaleimide, N-cyclohexylmaleimide, N-phenylmaleimide, N-(4-chlorophenyl)maleimide, 2-methyl-N-phenylmaleimide, N-(4-bromophenyl)maleimide, N-(4-nitrophenyl)maleimide, N-(4-hydroxyphenyl)maleimide, N-(4-methoxyphenyl)maleimide, N-(4-carboxyphenyl)maleimide, and N-benzylmaleimide, and, among these compounds, N-phenyl maleimide is preferred.

The aromatic vinyl-based unit may be a unit derived from an aromatic vinyl-based polymer prepared by polymerizing an aromatic vinyl-based monomer.

The first styrene-based copolymer may include the maleimide-based unit and the aromatic vinyl-based unit in a weight ratio of 30:70 to 50:50, 40:60 to 50:50, or 45:55 to 50:50, and preferably in a weight ratio of 45:55 to 50:50. When the weight ratio of the maleimide-based unit and the aromatic vinyl-based unit falls within the above range, the first styrene-based copolymer may attain excellent heat resistance and excellent fluidity.

The first styrene-based copolymer may have a glass transition temperature of 160 to 200° C., 175 to 195° C., or 180 to 190° C., and preferably has a glass transition temperature of 180 to 190° C. When the glass transition temperature of the first styrene-based copolymer falls within the above range, the heat-resistant resin composition may attain further improved heat resistance.

Here, the glass transition temperature may be measured by differential scanning calorimetry.

The first styrene-based copolymer may have a weight average molecular weight of 80,000 to 180,000 g/mol, 85,000 to 140,000 g/mol, or 90,000 to 110,000 g/mol, and preferably has a weight average molecular weight of 90,000 to 110,000 g/mol. When the weight average molecular weight of the first styrene-based copolymer falls within the above range, not only stable heat resistance may be attained, but also excellent fluidity may also be ensured.

The first styrene-based copolymer may be a copolymer prepared using a mixture of a maleimide-based monomer and an aromatic vinyl-based polymer, and specifically, may be a copolymer prepared by reactive extrusion of a maleimide-based monomer and an aromatic vinyl-based polymer. In the preparation of the first styrene-based copolymer, maleic anhydride (MAH) may be further added, and MAH may be removed when the reaction is completed.

Here, the reactive extrusion may mean that polymerization and molding are performed at the same time by adding a maleimide-based monomer and an aromatic vinyl polymer to an extruder.

The first styrene-based copolymer may be included in an amount of 5 to 40 wt %, 10 to 35 wt %, 10 to 25 wt %, or 15 to 20 wt % with respect to the total weight of the heat-resistant resin composition, and is preferably included in an amount of 15 to 20 wt %. When the content of the first styrene-based copolymer falls within the above range, the heat-resistant resin composition may attain high fluidity, excellent heat resistance, and excellent surface characteristics. When the content of the first styrene-based copolymer is less than the above range, heat resistance may be significantly degraded, and when the content of the first styrene-based copolymer is greater than the above range, impact resistance, fluidity, and surface characteristics may be degraded.

3) Second Styrene-Based Copolymer

The second styrene-based copolymer includes a vinyl cyan-based unit and an aromatic vinyl-based unit, and the vinyl cyan-based unit is included in an amount different from that of a third styrene-based copolymer to be described below.

The second styrene-based copolymer allows the heat-resistant resin composition to harmoniously realize properties, that is, mechanical properties, fluidity, and heat resistance.

The second styrene-based copolymer may be a copolymer prepared using a vinyl cyan-based monomer and an aromatic vinyl-based monomer. The monomer mixture may include a vinyl cyan-based monomer and an aromatic vinyl-based monomer in a weight ratio of 27:73 to 35:65 or 28:72 to 33:68, and preferably in a weight ratio of 28:72 to 32:68. When the weight ratio of a vinyl cyan-based monomer and an aromatic vinyl-based monomer falls within the above range, properties, that is, mechanical properties, fluidity, and heat resistance of the heat-resistant resin composition may be harmoniously realized. When an excessively small amount of the vinyl cyan-based monomer is included, heat resistance and mechanical properties of the heat-resistant resin composition may be degraded, and when an excessively large amount of the vinyl cyan-based monomer is included, fluidity of the heat-resistant resin composition may be degraded.

Types of the aromatic vinyl-based monomer and the vinyl cyan-based monomer are as described above.

The second styrene-based copolymer may have a weight average molecular weight of 80,000 to 130,000 g/mol, 85,000 to 120,000 g/mol, or 90,000 to 110,000 g/mol, and preferably has a weight average molecular weight of 90,000 to 110,000 g/mol. When the weight average molecular weight of the second styrene-based copolymer falls within the above range, fluidity may be further improved while mechanical properties, fluidity, and heat resistance of the second styrene-based copolymer are harmoniously realized.

The second styrene-based copolymer may have a melt flow index (220° C., 10 kg) of 20 to 60 g/10 min, 30 to 55 g/10 min, or 40 to 50 g/10 min, as measured in accordance with ASTM D1238, and preferably has a melt flow index of 40 to 50 g/10 min. When the melt flow index of the second styrene-based copolymer falls within the above range, the second styrene-based copolymer may attain not only excellent fluidity but also excellent mechanical properties.

The second styrene-based copolymer may be a styrene/acrylonitrile copolymer.

The second styrene-based copolymer may be prepared using an aromatic vinyl-based monomer and a vinyl cyan-based monomer by one or more methods selected from the group consisting of emulsion polymerization, suspension polymerization, and bulk polymerization, and, among these methods, emulsion polymerization is preferably used.

The second styrene-based copolymer may be included in an amount of 5 to 40 wt %, 10 to 35 wt %, 10 to 25 wt %, or 15 to 25 wt % with respect to the total weight of the heat-resistant resin composition, and is preferably included in an amount of 15 to 25 wt %. When the content of the second styrene-based copolymer fails within the above range, properties, that is, mechanical properties, fluidity, and heat resistance of the heat-resistant resin composition may be harmoniously realized.

4) Third Styrene-Based Copolymer

The third styrene-based copolymer includes a vinyl cyan-based unit and an aromatic vinyl-based unit.

The third styrene-based copolymer may impart excellent fluidity, chemical resistance, and surface characteristics to the heat-resistant resin composition. Also, the third styrene-based copolymer allows the graft copolymer to be uniformly dispersed in a heat-resistant resin composition.

The third styrene-based copolymer may be a copolymer prepared using a monomer mixture including a vinyl cyan-based monomer and an aromatic vinyl-based monomer. The monomer mixture may include a vinyl cyan-based monomer and an aromatic vinyl-based monomer in a weight ratio of 15:85 to 26:74 or 20:80 to 25:75, and preferably in a weight ratio of 20:80 to 25:75. When the weight ratio of a vinyl cyan-based monomer and an aromatic vinyl-based monomer falls within the above range, high fluidity and chemical resistance may be imparted to the heat-resistant resin composition, and the graft copolymer may be uniformly dispersed in the heat-resistant resin composition. Accordingly, an injection molded article formed of the heat-resistant resin composition may attain excellent injection surface characteristics. Also, excellent reflectance after vacuum metal deposition may be attained due to excellent injection surface characteristics. When the content of the vinyl cyan-based monomer is less than the above range, chemical resistance and surface characteristics may be degraded, and when the content of the vinyl cyan-based monomer is greater than the above range, it is not possible to impart high fluidity to the heat-resistant resin composition.

The third styrene-based copolymer may have a weight average molecular weight of 110,000 to 130,000 g/mol, 115,000 to 125,000 g/mol, or 117,500 to 122,500 g/mol, and preferably has a weight average molecular weight of 117,500 to 122,500 g/mol. When the weight average molecular weight of the third styrene-based copolymer falls within the above range, the heat-resistant resin composition may attain high fluidity.

The third styrene-based copolymer may have a melt flow index (220° C., 10 kg) of 40 to 100 g/10 min or 50 to 90 g/10 min, as measured in accordance with ASTM D1238, and preferably has a melt flow index 55 to 70 g/10 min. When the melt flow index of the third styrene-based copolymer falls within the above range, the heat-resistant resin composition may attain high fluidity, and thus excellent surface characteristics may be realized.

The third styrene-based copolymer may be a styrene/acrylonitrile copolymer.

The third styrene-based copolymer may be prepared using an aromatic vinyl-based monomer and a vinyl cyan-based monomer by one or more methods selected from the group consisting of emulsion polymerization, suspension polymerization, and bulk polymerization, and, among these methods, bulk polymerization is preferably used.

The third styrene-based copolymer may be included in an amount of 1 to 55 wt %, 5 to 50 wt %, 20 to 37 wt %, or 25 to 35 wt % with respect to the total weight of the heat-resistant resin composition, and is preferably included in an amount of 25 to 35 wt %. When the content of the third styrene-based copolymer falls within the above range, higher fluidity and more excellent surface characteristics may be imparted to the heat-resistant resin composition. When the content of the third styrene-based copolymer is less or greater than the above range, the heat-resistant resin composition may not attain excellent surface characteristics.

5) Fourth Styrene-Based Copolymer

The fourth styrene-based copolymer may include a vinyl cyan-based unit and an aromatic vinyl-based unit.

The fourth styrene-based copolymer may be included to further increase fluidity of the heat-resistant resin composition.

The fourth styrene-based copolymer may be a copolymer prepared using a monomer mixture including a vinyl cyan-based monomer and an aromatic vinyl-based monomer.

The fourth styrene-based copolymer may have a weight average molecular weight of 30,000 g/mol or more and less than 80,000 g/mol, 40,000 to 75,000 g/mol, or 50,000 to 70,000 g/mol, and preferably has a weight average molecular weight of 50,000 to 70,000 g/mol. When the weight average molecular weight of the fourth styrene-based copolymer falls within the above range, not only fluidity of the heat-resistant resin composition increases, but also stable production is possible upon extrusion.

The fourth styrene-based copolymer may have a melt flow index (220° C., 10 kg) of greater than 80 g/10 min or greater than 80 g/10 min to 100 g/10 min, as measured in accordance with ASTM D1238. When the melt flow index of the fourth styrene-based copolymer falls within the above range, the heat-resistant resin composition may attain high fluidity and excellent surface characteristics.

The fourth styrene-based copolymer may have an average particle size of 0.07 to 0.7 μm or 0.1 to 0.6 μm, and preferably has an average particle size of 0.15 to 0.4 μm. When the average particle size of the fourth styrene-based copolymer falls within the above range, surface characteristics of an injection molded article may be further improved.

The fourth styrene-based copolymer may be included in an amount of 0.1 to 7 wt %, 0.5 to 5 wt %, or 1 to 3 wt % with respect to the total weight of the heat-resistant resin composition, and is preferably included in an amount of 1 to 3 wt %. When the content of the fourth styrene-based copolymer falls within the above range, the heat-resistant resin composition may attain high fluidity.

2. Heat-Resistant Resin Pellet

According to another embodiment of the present invention, a heat-resistant resin pellet is prepared using the heat-resistant resin composition according to an embodiment of the present invention, and has a melt flow index (220° C., 10 kg) of 10 g/10 min or more, preferably 13 g/10 min or more, and more preferably 15 g/10 min or more, as measured in accordance with ASTM D1238. When the melt flow index of the heat-resistant resin pellet falls within the above range, excellent fluidity is exhibited upon injection molding, and thus a heat-resistant resin molded article with excellent injection surface characteristics may be formed.

3. Heat-Resistant Resin Molded Article

According to still another embodiment of the present invention, a heat-resistant resin molded article is formed of the heat-resistant resin composition according to an embodiment of the present invention, and has a diffuse reflectance, after metal deposition, of 4% or less, preferably 3.9% or less, and more preferably 3.6% or less.

When the diffuse reflectance, after metal deposition, of the heat-resistant resin molded article falls within the above range, excellent surface characteristics are exhibited, and thus significantly excellent surface characteristics may be realized after metal deposition.

Hereinafter, the present invention will be described in detail with reference to embodiments so that those skilled in the art can easily carry out the present invention. However, the present invention may be realized in several different forms, and therefore, is not limited to embodiments described herein.

Preparation Example 1

<Preparation of Diene-Based Rubber Polymer>

65 parts by weight of ion exchanged water, 75 parts by weight of 1,3-butadiene as a monomer, 1.2 parts by weight of potassium rosinate as an emulsifier, 0.8 part by weight of potassium oleate, 3.0 parts by weight of acrylonitrile, 1.5 parts by weight of calcium carbonate ($K_2CO_3$) as an electrolyte, 0.3 part by weight of t-dodecyl mercaptan as a molecular weight controlling agent, and 0.3 part by weight of potassium persulfate ($K_2S_2O_8$) as an initiator were batch-added to a nitrogen-substituted polymerization reactor, and polymerized at a reaction temperature of 65° C. until a polymerization conversion rate reached 35%.

Subsequently, 15 parts by weight of 1,3-butadiene was batch-added to the reactor and polymerized at 75° C. until a polymerization conversion rate reached 60%. Then, 10 parts by weight of the remaining 1,3-butadiene was batch-added to the reactor, the temperature inside the reactor was raised to 80° C., and polymerization was then performed until a polymerization conversion rate reached 93% to prepare a butadiene rubber polymer latex. In this case, the butadiene rubber polymer latex had an average particle size of 100 nm.

<Preparation of Graft Copolymer>

60 parts by weight (based on solid content) of the obtained butadiene rubber polymer latex, 70 parts by weight of ion exchanged water, 0.1 part by weight of sodium ethylenediaminetetraacetate, 0.005 part by weight of ferrous sulfate, 0.23 part by weight of sodium formaldehyde sulfoxylate, and 0.35 part by weight of potassium rosinate were batch-added to a reactor, and the temperature inside the reactor was raised to 70° C.

Subsequently, polymerization was performed while a mixture including 30 parts by weight of styrene, 30 parts by weight of ion exchanged water, 0.65 part by weight of potassium rosinate, 10 parts by weight of acrylonitrile, 0.4 part by weight of t-dodecyl mercaptan, and 0.4 part by weight of diisopropylenebenzenehydroperoxide was continuously added at a predetermined rate for 3 hours. Afterward, the temperature inside the reactor was raised to 80° C., an aging process was then performed for 1 hour, and the polymerization was terminated to prepare a graft copolymer latex.

Subsequently, 333 parts by weight of ion exchanged water and 3 parts by weight of an aqueous sulfate solution were sequentially added to a coagulation reactor, and the temperature inside the reactor was then raised to 75° C. while stirring. Afterward, the graft copolymer latex was continuously added to the coagulation reactor at a predetermined rate for 5 minutes. Then, the temperature inside the reactor was raised to 90° C., and an aging process was performed for 3 minutes to obtain the aged graft copolymer. The aged graft copolymer was dehydrated in a centrifugal dehydrator at 1,800 rpm/min for 3 minutes and dried in a fluidized bed dryer for 2 hours to prepare a graft copolymer in the form of a powder.

Preparation Example 2

70 parts by weight of styrene, 18 parts by weight of acrylonitrile, 140 parts by weight of ion exchanged water, 2.0 parts by weight of sodium dibenzenesulfonate as an emulsifier, 0.1 part by weight of sodium phosphate ($Na_3PO_4$) as an electrolyte, 0.45 part by weight of t-dodecyl mercaptan as a molecular weight controlling agent, 0.05 part by weight of t-butyl hydroperoxide as an initiator, 0.025 part by weight of dextrose, 0.05 part by weight of sodium pyrophosphate, and 0.0005 part by weight of ferrous sulfate were batch-added to a nitrogen-substituted polymerization reactor, and polymerized at a reaction temperature of 50° C. until a polymerization conversion rate reached 35%. Then, a mixed solution including 25 parts by weight of ion exchanged water, 12 parts by weight of acrylonitrile, and 0.5 part by weight of sodium dibenzenesulfonate was continuously added to the reactor at a predetermined rate. Afterward, the temperature inside the reactor was raised to 80° C., and the polymerization was then terminated when a polymerization conversion rate was 98% to prepare a copolymer latex.

Subsequently, 333 parts by weight of ion exchanged water and 3 parts by weight of calcium chloride were sequentially added to a coagulation reactor, and the temperature inside the reactor was raised to 95° C. while stirring. The copolymer latex was continuously added to the coagulation reactor at a predetermined rate for 5 minutes.

The coagulated copolymer was dehydrated in a centrifugal dehydrator at 1,800 rpm/min for 3 minutes and then dried in a fluidized bed dryer for 2 hours to prepare a copolymer having a weight average molecular weight of 100,000 g/mol in the form of a powder.

Examples and Comparative Examples

The specifications of components used in Examples and Comparative Examples below are as follows.

(A) Graft Copolymer (A-1) First graft copolymer: DP270M manufactured by LG Chem Ltd. (a graft copolymer prepared by copolymerizing butadiene rubber polymer having an average particle size of 300 nm with styrene and acrylonitrile) was used.

(A-2) Second graft copolymer: The graft copolymer according to Preparation Example 1 was used.

(B) First styrene-based copolymer: MSMJ manufactured by Denka Co., Ltd. (a copolymer of N-phenyl maleimide and polystyrene) was used.

(C) Second styrene-based copolymer: The copolymer according to Preparation Example 2 was used.

(D) Third styrene-based copolymer: 81HF manufactured by LG Chem Ltd. (a copolymer prepared using a monomer mixture including acrylonitrile and styrene in a weight ratio of 24:76 and having a weight average molecular weight of 120,000 g/mol) was used.

(E) Fourth styrene-based copolymer: EMI-200 manufactured by SUNNY FC (a copolymer of acrylonitrile and styrene) was used.

(F) Fifth styrene-based copolymer: 98UHM manufactured by LG Chem Ltd. was used.

(G) Lubricant: EBA manufactured by LG Household & Health Care Ltd. (ethylene bis stearamide) was used.

The above-described components were mixed in contents as listed in Table 1 and Table 2 below and stirred to prepare heat-resistant resin compositions.

Experimental Example 1

Each of the heat-resistant resin compositions according to Examples and Comparative Examples was extruded to prepare the composition as a pellet, and a property of the pellet was evaluated by a method as described below. Results thereof are shown in Table 1 and Table 2 below.

(1) Melt flow index (g/10 min): measured under conditions of 220° C. and 10 kg in accordance with ASTM D1238

Experimental Example 2

The pellet according to Experimental Example 1 was injected to prepare a specimen, and properties of the specimen were evaluated by methods as described below. Results thereof are shown in Table 1 and Table 2 below.

(2) Impact strength (kg·cm/cm): measured using a ¼-inch notched specimen in accordance with ASTM D256

(3) HDT (° C.): measured under conditions of ¼ inch, 18.6 kgf, and 120° C./hr in accordance with ASTM D648-7

Experimental Example 3

Aluminum (Al) was vacuum-deposited on the surface of the specimen according to Experimental Example 2 using vacuum deposition equipment (trade name: High Vacuum Coating Equipment manufactured by Daehan Vacuum Engineering Co.). Properties of the specimen on which an Al film was formed were measured by a method as described below, and results thereof are shown in Table 1 and Table 2 below.

TABLE 1

| Classification | | | Examples | | | | | |
|---|---|---|---|---|---|---|---|---|
| | | | 1 | 2 | 3 | 4 | 5 | 6 |
| (A) Graft copolymer (parts by weight) | (A-1) First graft copolymer | | 18 | 18 | 25 | 25 | 25 | 18 |
| | (A-2) Second graft copolymer | | 7 | 7 | — | — | — | 7 |
| (B) First styrene-based copolymer (parts by weight) | | | 19 | 19 | 17 | 20 | 19 | 21 |
| (C) Second styrene-based copolymer (parts by weight) | | | 21 | 23 | 21 | 40 | 21 | 22 |
| (D) Third styrene-based copolymer (parts by weight) | | | 32 | 33 | 34 | 12 | 32 | 32 |
| (E) Fourth styrene-based copolymer (parts by weight) | | | 3 | — | 3 | 3 | 3 | — |
| (F) Fifth styrene-based copolymer (parts by weight) | | | — | — | — | — | — | — |
| (G) Lubricant (parts by weight) | | | 0.5 | 0.5 | — | 0.5 | 0.5 | 0.5 |
| Melt flow index | | | 18.3 | 15.3 | 20 | 18 | 17.9 | 15.2 |
| Impact strength | | | 12.9 | 12.7 | 11.9 | 10.4 | 12 | 12.6 |
| HDT | | | 100.3 | 100 | 99 | 101 | 100.9 | 101.3 |
| Diffuse reflectance | | | 3.5 | 3.9 | 3.6 | 4 | 4 | 3.8 |
| Total reflectance | | | 90 | 90.3 | 90 | 90 | 90 | 90 |

TABLE 2

| Classification | | | Comparative Examples | | | | | |
|---|---|---|---|---|---|---|---|---|
| | | | 1 | 2 | 3 | 4 | 5 | 6 |
| (A) Graft copolymer (parts by weight) | (A-1) First graft copolymer | | 25 | 19 | 28 | 18 | 18 | 18 |
| | (A-1) Second graft copolymer | | — | 3 | — | 7 | 7 | 7 |
| (B) First styrene-based copolymer (parts by weight) | | | — | — | 35 | — | 19 | 19 |
| (C) Second styrene-based copolymer (parts by weight) | | | — | — | — | 21 | — | 53 |
| (D) Third styrene-based copolymer (parts by weight) | | | — | 13 | 37 | 32 | 53 | — |
| (E) Fourth styrene-based copolymer (parts by weight) | | | 3 | 3 | — | 3 | 3 | 3 |
| (F) Fifth styrene-based copolymer (parts by weight) | | | 72 | 62 | — | 19 | — | — |
| (G) Lubricant (parts by weight) | | | 0.5 | 0.5 | 0.5 | 0.5 | 0.5 | 0.5 |
| Melt flow index | | | 5.8 | 9.9 | 6 | 15 | 17.5 | 19 |
| Impact strength | | | 16 | 12.5 | 11 | 18 | 11.4 | 12.5 |
| HDT | | | 100 | 99 | 110 | 91 | 101.5 | 100.9 |
| Diffuse reflectance | | | 5.08 | 4.08 | 11 | 4.1 | 4.4 | 6 |
| Total reflectance | | | 91 | 91 | 80 | 90 | 90 | 90 |

Referring to Table 1 and Table 2, it can be confirmed that Examples 1 to 6 exhibited a melt flow index of 15 g/10 min or more which indicated excellent processability, an impact strength of 10 kg·cm/cm or more which indicated excellent impact resistance, a heat deflection temperature of 99° C. or more which indicated excellent heat resistance, and a diffuse reflectance of 4% or less which indicated significantly excellent surface characteristics. However, it can be confirmed that Comparative Example 1, in which first to third styrene-based copolymers were not included, Comparative Example 2, in which first and second styrene-based copolymers were not included, and Comparative Example 3, in which a second styrene-based copolymer was not included, exhibited a significantly lower melt flow index and a higher diffuse reflectance compared to Examples 1 to 6, indicating that processability and surface characteristics were degraded. It can be confirmed that Comparative Example 4, in which a first styrene-based copolymer was not included, exhibited a lower heat deflection temperature and a higher diffuse reflectance compared to Examples 1 to 6, indicating that heat resistance and surface characteristics were degraded. It can be confirmed that Comparative Examples 5 and 6, in which a second styrene-based copolymer and a third styrene-based copolymer were not included, respectively, exhibited a higher diffuse reflectance compared to Examples 1 to 6, indicating that surface characteristics were degraded.

The invention claimed is:

1. A heat-resistant resin composition comprising:
a graft copolymer prepared by graft polymerization of a diene-based rubber polymer with an aromatic vinyl-based monomer and a vinyl cyan-based monomer;
a first styrene-based copolymer comprising a maleimide-based unit and an aromatic vinyl-based unit in a weight ratio of 30:70 to 50:50;
a second styrene-based copolymer comprising a vinyl cyan-based unit and an aromatic vinyl-based unit, wherein the second styrene-based copolymer is a copolymer prepared using a monomer mixture comprising a vinyl cyan-based monomer and an aromatic vinyl-based monomer in a weight ratio of 27:73 to 35:65, and has a weight average molecular weight of 80,000 to 130,000 g/mol; and
a third styrene-based copolymer comprising a vinyl cyan-based unit and an aromatic vinyl-based unit, wherein the third styrene-based copolymer is a copolymer prepared using a monomer mixture comprising a vinyl cyan-based monomer and an aromatic vinyl-based monomer in a weight ratio of 15:85 to 26:74, and has a weight average molecular weight of 110,000 to 130,000 g/mol;
wherein the second styrene-based copolymer and the third styrene-based copolymer comprise a vinyl cyan-based unit in mutually different amounts.

2. The heat-resistant resin composition of claim 1, wherein the graft copolymer comprises a first graft copolymer and a second graft copolymer comprising diene-based rubber polymers with mutually different average particle sizes.

3. The heat-resistant resin composition of claim 2, wherein the first graft copolymer comprises a diene-based rubber polymer having an average particle size of 200 to 500 nm, and the second graft copolymer comprises a diene-based rubber polymer having an average particle size of 50 to 190 nm.

4. The heat-resistant resin composition of claim 1, wherein the first styrene-based copolymer is a copolymer prepared using a mixture comprising a maleimide-based monomer and an aromatic vinyl-based polymer.

5. The heat-resistant resin composition of claim 1, which comprises:
the graft copolymer in an amount of 10 to 45 wt %;
the first styrene-based copolymer in an amount of 5 to 40 wt %;
the second styrene-based copolymer in an amount of 1 to 50 wt %; and
the third styrene-based copolymer in an amount of 1 to 55 wt %.

6. The heat-resistant resin composition of claim 1, which comprises:
the graft copolymer in an amount of 10 to 45 wt %;
the first styrene-based copolymer in an amount of 10 to 25 wt %;
the second styrene-based copolymer in an amount of 10 to 30 wt %; and
the third styrene-based copolymer in an amount of 20 to 37 wt %.

7. The heat-resistant resin composition of claim 2, which comprises:
the first graft copolymer in an amount of 9 to 28 wt %;
the second graft copolymer in an amount of 1 to 17 wt %;
the first styrene-based copolymer in an amount of 5 to 40 wt %;
the second styrene-based copolymer in an amount of 1 to 50 wt %; and
the third styrene-based copolymer in an amount of 1 to 55 wt %.

8. A heat-resistant resin pellet prepared using the heat-resistant resin composition of claim 1 and having a melt flow index of 10 g/10 min or more.

9. A heat-resistant resin molded article formed of a heat-resistant resin composition and having a diffuse reflectance of 4% or less after metal deposition, wherein the heat-resistant resin composition comprises:
a graft copolymer prepared by graft polymerization of a diene-based rubber polymer with an aromatic vinyl-based monomer and a vinyl cyan-based monomer;
a first styrene-based copolymer comprising a maleimide-based unit and an aromatic vinyl-based unit;
a second styrene-based copolymer comprising a vinyl cyan-based unit and an aromatic vinyl-based unit; and
a third styrene-based copolymer comprising a vinyl cyan-based unit and an aromatic vinyl-based unit;
wherein the second styrene-based copolymer and the third styrene-based copolymer comprise a vinyl cyan-based unit in mutually different amounts.

* * * * *